United States Patent
Sotozaki (10) Patent No.: US 6,616,512 B2
(45) Date of Patent: Sep. 9, 2003

(54) SUBSTRATE CLEANING APPARATUS AND SUBSTRATE POLISHING APPARATUS WITH SUBSTRATE CLEANING APPARATUS

(75) Inventor: Hiroshi Sotozaki, Kanagawa (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/915,289

(22) Filed: Jul. 27, 2001

(65) Prior Publication Data

US 2002/0045413 A1 Apr. 18, 2002

(30) Foreign Application Priority Data

Jul. 28, 2000 (JP) ........................................ 2000-229104
Aug. 10, 2000 (JP) ........................................ 2000-242905

(51) Int. Cl.⁷ ................................................ B24B 1/00
(52) U.S. Cl. ............................ 451/54; 451/65; 451/67; 451/451; 451/453; 134/1; 134/18
(58) Field of Search ............................ 451/54, 65, 67, 451/451, 453, 456; 134/2, 118, 134

(56) References Cited

U.S. PATENT DOCUMENTS 5,653,623 A * 8/1997 Kimura et al. ................ 451/72
6,042,455 A * 3/2000 Togawa et al. ................. 451/8
6,332,835 B1 * 12/2001 Nishimura et al. ........... 451/67
6,461,444 B1 * 10/2002 Nishio et al. ................. 134/29

FOREIGN PATENT DOCUMENTS

JP       10-163146       6/1998
JP     2000-340632      12/2000

* cited by examiner

Primary Examiner—Lee D. Wilson
Assistant Examiner—Alvin J Grant
(74) Attorney, Agent, or Firm—Wenderoth, Lind & Ponack, L.L.P.

(57) ABSTRACT

A substrate cleaning apparatus is provided which comprises a box in which a substrate is cleaned with a cleaning liquid, and an exhaust system for exhausting the box, wherein the box is provided in its upper wall with an air intake opening and the exhaust system is fluidly connected to the box at a lower wall of the box so that air is introduced into the box through the air intake opening, flows down in the box passing around the substrate and finally exits the box through the exhaust system. A door is provided to close the air intake opening when an inside air pressure in the box becomes greater than an outside air pressure outside the box.

17 Claims, 7 Drawing Sheets

SUBSTRATE CLEANING APPARATUS AND SUBSTRATE POLISHING APPARATUS WITH SUBSTRATE CLEANING APPARATUS

BACKGROUND OF THE INVENTION

The present invention relates to a substrate cleaning apparatus including a cleaning box, in which a substrate such as a semiconductor wafer is cleaned with a cleaning liquid and then dried, and also relates to a polishing apparatus equipped with such a substrate cleaning apparatus.

Typical in the prior art, a cleaning box of a substrate cleaning apparatus is provided with a substrate rotating mechanism located within the cleaning box. During a cleaning operation, a substrate is held in a horizontal plane by the rotating mechanism and rotated about its central axis, while a cleaning liquid, for example, a chemical cleaning liquid, is supplied to the surface of the substrate. In the conventional cleaning apparatus, to prevent a substrate cleaning liquid from diffusing outside the cleaning box during a cleaning operation, a closed-type cleaning box has been used; and during a cleaning operation, a negative pressure is applied to the inside of the box. When cleaning of the substrate is complete, it is preferably rotated at high speed to effect spin-drying. During a drying operation; however, there is a likelihood of liquid in mist form remaining in the closed-type cleaning box and being deposited on and contaminating a surface of the substrate being dried.

To avoid this problem, conventionally, a drying box has been provided separate from a cleaning box. The drawback of such an arrangement is that it results in an increase in size and cost of the cleaning apparatus.

The present invention has been made with a view to overcoming this problem, and provides a substrate cleaning apparatus by which a substrate can be cleaned and dried in a single dual-function box.

SUMMARY OF THE INVENTION

In accordance with the present invention, there is provided a substrate cleaning apparatus comprising a box in which a substrate is cleaned with a cleaning liquid, and an exhaust system for exhausting the box. The box is provided with an air intake opening for introducing air into the box to create an airflow passing around the substrate in the box and thereafter entering the exhaust system. The box is also provided with a door operable to close the air intake opening when an inside air pressure in the box becomes greater than an outside air pressure outside the box.

Specifically, the air intake opening is provided in the top wall of the box and the exhaust system is fluidly connected to the box at the bottom wall of the same to create an air flow flowing down in the box. The box is provided inside with a substrate rotating mechanism for rotating a substrate about its central axis, and at least one nozzle for supplying cleaning liquid to the substrate, while the substrate is rotated by the substrate rotating mechanism, to conduct a cleaning operation of the substrate. The substrate rotating mechanism is also operable to rotate the substrate at high speed after completion of the cleaning operation to dry the substrate.

In accordance with another aspect of the present invention, instead of provision of the door for closing the air intake opening, there is provided in the box at least one water nozzle for discharging water to form a water barrier across the air intake opening for preventing the cleaning liquid in mist or gas form from dispersing outside the box through the air intake opening. Specifically, there are provided two water nozzles which extend along either side edge of the air intake opening and discharge water in the form of a sheet in such a manner that the water discharged from the water nozzles cross each other to form the barrier. A plurality of baffle plates are provided over the air intake opening to form a plurality of air passages which allow air to freely pass therethrough, and also to check the water discharged from the water nozzle from scattering towards the outside of the box through the air intake opening. A control may be provided which operates the water nozzles to discharge water to form the barrier when an air pressure in the box is greater than an air pressure outside the box or when the exhaust system is broken down.

Further, the present invention provides a substrate polishing apparatus comprising a housing having a polishing chamber and a cleaning chamber. The polishing chamber is provided inside with a turntable having a polishing surface, and a substrate carrier for carrying a substrate to bring the substrate into contact with the polishing surface of the turntable for polishing the substrate, wherein the cleaning chamber is provided with at least one cleaning apparatus as stated above.

The above and other objects, features and advantages of the present invention will become apparent by reading the following description of the preferred embodiments, with reference to the accompanying drawings.

DETAILED DESCRIPTION OF THE INVENTION

Preferred embodiments of the present invention will now be explained with reference to the attached drawings.

Figure 1:
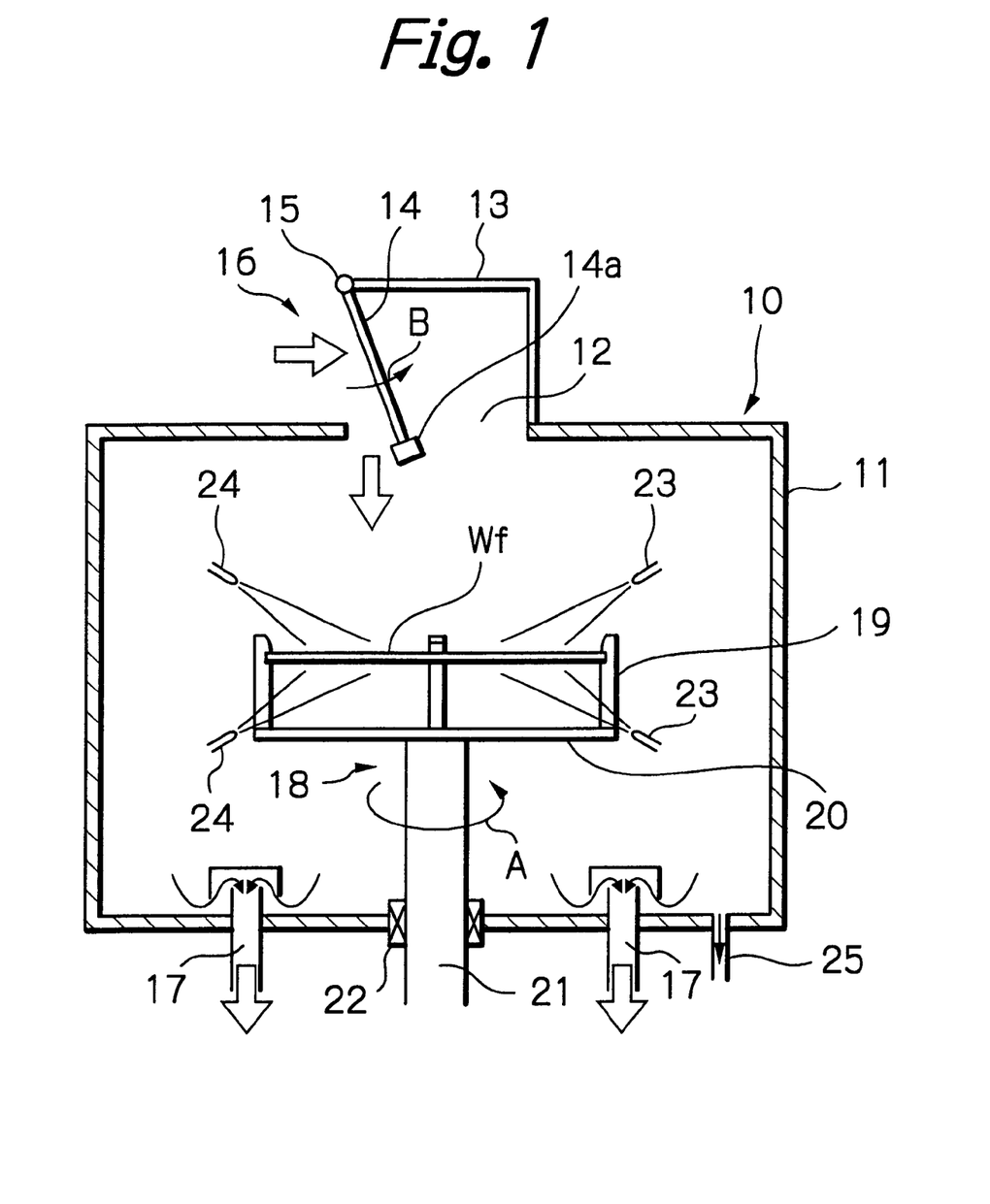
FIG. 1 is a schematic cross-sectional view of a cleaning apparatus in accordance with a first embodiment of the present invention.

FIG. 1 is a schematic cross-sectional view of a cleaning apparatus 10 in accordance with an embodiment of the present invention. The cleaning apparatus 10 includes a cleaning/drying box 11 provided in its upper wall with an air intake opening 12 for introducing clean air into the cleaning box. Over the opening 12, there is provided a box-like cover 13 having an air introduction opening 16 and a pivotable door 14 for closing the opening 12. The door 14 is provided at its distal or lower end with a weight 14a, and is supported by a hinge 15.

The cleaning/drying box 11 is provided in its lower wall with exhaust openings 17 which are connected to an exhaust system (not shown). In the cleaning/drying box 11, there is provided a substrate rotating mechanism 18 for holding and rotating a substrate Wf such as a semiconductor wafer. The rotating mechanism 18 includes a rotatable base member 20 and a plurality (four in this example) of holding posts 19 provided on the base member 20, which are adapted to engage with an outer peripheral edge of the substrate Wf to hold the substrate in a horizontal plane. The rotatable base member 20 is supported on an upper end of a rotatable shaft 21 and rotated in a direction A by a motor (not shown) through the rotatable shaft 21. In FIG. 1, reference numeral 22 denotes a sealing means for sealing a gap formed between the rotatable shaft and an opening of the lower wall of the cleaning/drying box 11 through which the rotatable shaft extends. Reference 25 denotes a drain opening.

Chemical cleaning liquid nozzles 23 are provided to supply sprays or jets of chemical cleaning liquid to upper and lower surfaces of the substrate Wf held by the substrate rotating mechanism 18. Further, ultrapure water nozzles 24 are provided to supply sprays or jets of ultrapure water to the upper and lower surfaces of the substrate Wf Although not illustrated, the substrate rotating mechanism 18 is provided with means for operating the substrate holding posts 19, whereby the substrate Wf transferred to the cleaning/drying box by a transfer robot (not shown) is accepted and clamped by the holding posts 19. After completion of a cleaning operation, the substrate Wf is removed by the transfer robot from the rotating mechanism and the cleaning/drying box 11.

Figure 2:
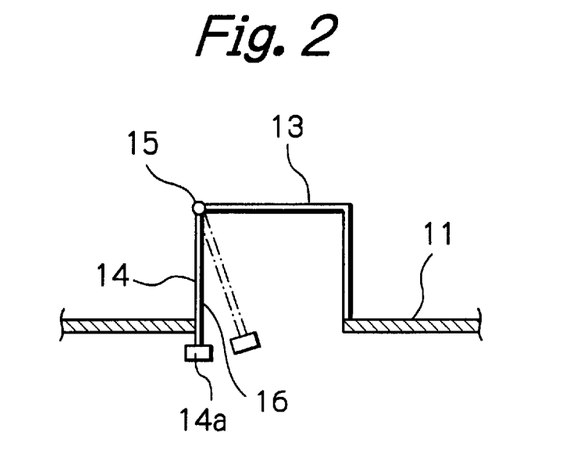
FIG. 2 is a schematic cross-sectional view of an air intake mechanism of the cleaning apparatus of FIG. 1.

When an air pressure Pin in the cleaning/drying box 11 is equal to an air pressure Pout outside the cleaning box 11, the door 14 is oriented vertically under the action of the weight 14a to close the opening 16 of the box-like cover 13, as shown in FIG. 2. In this condition, if the cleaning/drying box 11 is exhausted through the exhaust openings 17, the pressure Pin becomes lower than the pressure Pout, and, the door 14 is pivoted in a direction B to open the opening 16, as shown in FIG. 1. Thus, clean air is introduced into the cleaning/drying box 11 through the opening 16 and the air intake opening 12, which air flows down in the cleaning/drying box 11, and exits it via the exhaust openings 17.

Concurrently, the nozzles 23 supply jet-sprays of chemical cleaning liquid such as dilute hydrofluoric acid (DHF) to the upper and lower surfaces of the substrate Wf which is supported and rotated by the substrate rotating mechanism 18, whereby the substrate Wf is chemically cleaned. Following this chemical cleaning, the nozzles 24 supply jet-sprays of ultrapure water to the upper and lower surfaces of the substrate Wf, to remove any residual chemical cleaning liquid from the substrate. The substrate Wf is then rotated at high speed by the substrate rotating mechanism to effect spin-drying, and remove any residual water remaining on the upper or lower surfaces of the substrate Wf. During these cleaning and drying operations, clean air is supplied into and flows down through the cleaning/drying box 11 to prevent an employed chemical cleaning liquid and/or ultrapure water from diffusing outside the cleaning/drying box 11; and to also prevent a cleaned and/or dried substrate from being contaminated with cleaning liquid and/or water which have already been removed from the substrate.

In a case where the inside pressure Pin becomes greater than the outside pressure Pout due to, for example, a breakdown of the exhaust system, the weight 14a moves the door 14 into a position where it closes the opening 16 of the box-like cover 13 and prevents chemical cleaning liquid or water from diffusing outside the cleaning/drying box 11.

Figure 3:
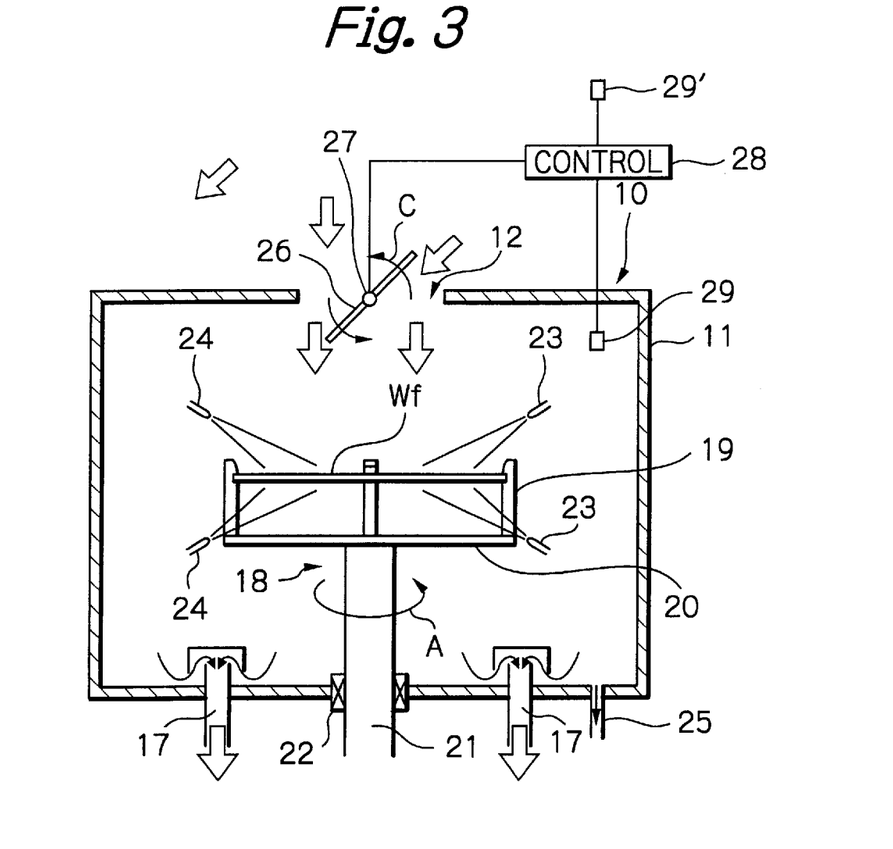
FIG. 3 is a schematic cross-sectional view of a cleaning apparatus in accordance with a second embodiment of the present invention.

FIG. 3 illustrates another embodiment of a substrate cleaning apparatus of the present invention. In this figure, like reference numerals denote like elements shown in the first embodiment which has been described above. The substrate cleaning apparatus has the same construction as that of the first embodiment except for its air intake mechanism. In this embodiment, the air intake mechanism includes a rotatable door 26 for opening and closing an air intake opening 12 which is provided in the top wall of the cleaning/drying box 11; and also includes a control 28 for controlling opening and closing of the rotatable door 26. The control 28 is connected to a pressure sensor 29 for sensing an air pressure Pin in the cleaning/drying box 11, and to a pressure sensor 29' for sensing an air pressure Pout outside the cleaning/drying box 11. If a pressure Pin is sensed as being lower than a pressure Pout, the control 28 functions to pivot the door 26 about a pivot shaft 27 in a direction C to open the air intake opening 12; and to pivot the door in a reverse direction when a converse pressure relation is sensed.

Figure 4:
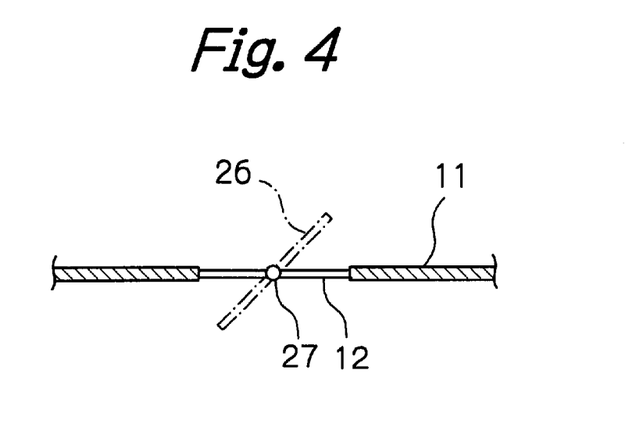
FIG. 4 is a schematic cross-sectional view of an air intake mechanism of the cleaning apparatus of FIG. 3.

Before a substrate cleaning operation commences, pressures Pin and Pout are generally equal, and the door 26 is positioned as shown in FIG. 4 to keep the air intake opening 12 closed. During a substrate cleaning operation, the cleaning/drying box 11 is exhausted through exhaust openings 17 to create a negative pressure in its interior. In response to this negative pressure, the control 28 functions to pivot the door 26 in the direction C to open the air intake opening 12, whereby clean air is introduced from the opening 12 to flow down in the box, and thereafter exit the box through the exhaust openings 17.

Under this condition, the nozzles 23 supply jet-sprays of chemical cleaning liquid such as dilute hydrofluoric acid (DHF) to the upper and lower surfaces of the substrate Wf which is supported and rotated by the substrate rotating mechanism 18, to clean the substrate Wf. Following cleaning, the nozzles 24 supply jet-sprays of ultrapure water to the upper and lower surfaces of the substrate Wf to remove any remaining chemical cleaning liquid. The substrate Wf is then rotated by the substrate rotating mechanism at high speed to effect spin-drying and remove any liquid remaining on the upper or lower surfaces of the substrate Wf. During the cleaning and drying operations, a clean air is supplied into and flows through the cleaning box, to prevent chemical cleaning liquid and/or ultrapure water from diffusing outside the cleaning/drying box 11; and to also prevent the substrate Wf from becoming contaminated by cleaning liquid and/or water which has already been removed from the substrate.

Figure 5:
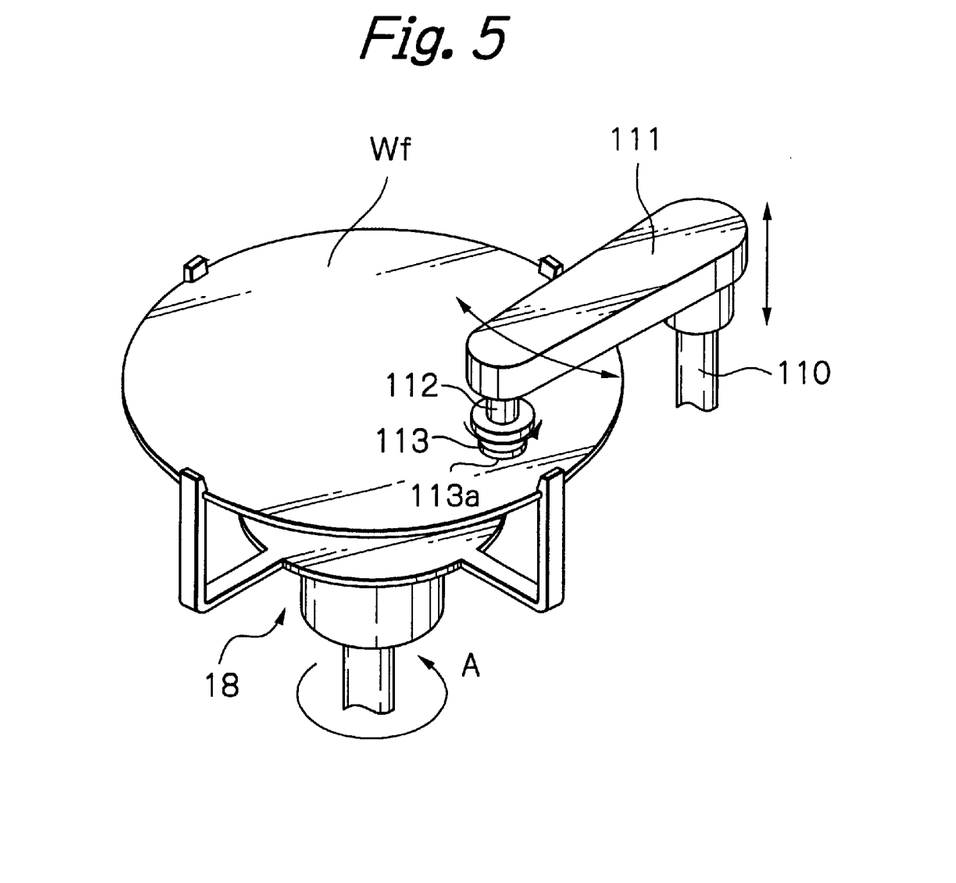
FIG. 5 is a perspective view of a substrate rotating mechanism and a substrate carrier employed in another type of cleaning apparatus of the present invention.

While in the embodiments described, cleaning of the substrate Wf is accomplished by directing jet-sprays of chemical cleaning liquid and ultrapure water from the nozzles 23 and 24, the present invention is not limited to these embodiments. In FIG. 5 a modification is illustrated where a scrub-type cleaning apparatus is provided, which device includes a pivotal arm 111 provided on a pivotal shaft 110, with a scrub-cleaning device 113 being provided at the distal end of the arm 111. The scrub-cleaning device 113 includes a vertical rotating shaft 112 which is adapted to be driven by a motor (not shown), and a cleaning element 113a made from a porous material such as a sponge, and mounted on a lower end of the rotating shaft 112. During a cleaning operation, during rotation of the cleaning element 113a in contact with a surface of the substrate Wf, a chemical cleaning liquid is first supplied to the surface of the substrate Wf by nozzles (not shown), after which ultrapure water is supplied to the surface. Following this cleaning operation, the arm 111 is pivoted to move the cleaning element 113a outside the outer periphery of the substrate Wf, and the substrate is then rotated at a high speed to effect spin-drying.

Figure 6:
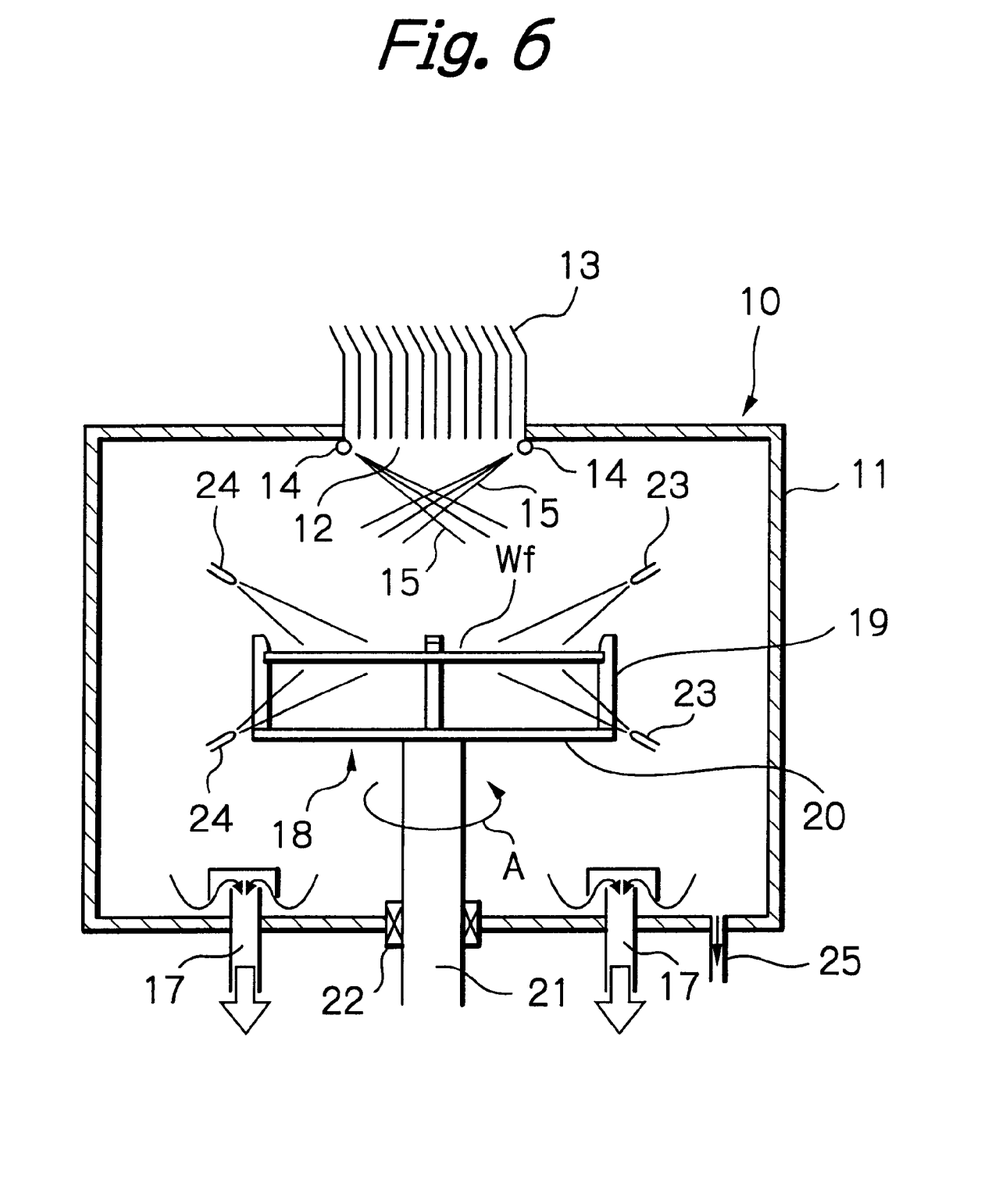
FIG. 6 is a schematic cross-sectional view of a cleaning apparatus of a fourth embodiment of the present invention.
Figure 7:
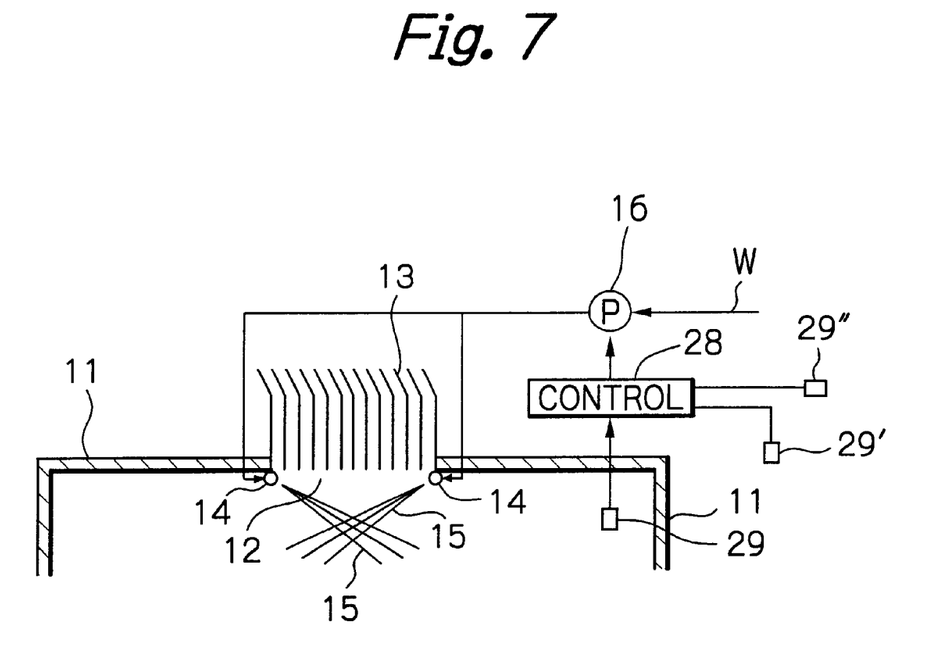
FIG. 7 is a schematic cross-sectional view of an air intake mechanism employed in the fourth embodiment.

FIG. 6 illustrates a fourth embodiment of a substrate cleaning apparatus of the present invention. The substrate cleaning apparatus has the same construction as that of the first embodiment except for its air intake mechanism. In this embodiment, the air intake mechanism includes a plurality of vertical baffle plates 13 each having a bend at its upper end. The baffle plates are provided across an air intake opening 12 formed in an upper wall of a cleaning/drying box with the baffle plates being parallel with each other. Further, the air intake mechanism includes a pair of nozzles 14 provided along either side edge of the air intake opening 12. The nozzles 14 are designed to discharge ultrapure water in the form of a sheet 15 in such a manner that the water sheets cross each other as shown in FIG. 6. FIG. 7 illustrates a water supply system of the nozzles 14. The system includes a pump 16 for supplying ultrapure water from a source 29" thereof to the nozzles 14, and a control 28 for controlling operation of the pump 16. The control 28 is connected to a pressure sensor 29 for sensing an air pressure Pin in the cleaning/drying box 11, and to a pressure sensor 29' for sensing an air pressure Pout outside the cleaning/drying box 11. Further, the control 28 is connected to a sensor 29" for detecting a breakdown of an exhaust system (not show) for exhausting the cleaning/drying box 11.

In this cleaning apparatus, cleaning and drying operations of a substrate are conducted in the same manner as that in the embodiment of FIGS. 1 and 2. The baffle plates prevent cleaning liquid and ultrapure water in mist form from dispersing outside the cleaning/drying box 11 through the air intake opening 12. When the air pressure Pin becomes greater than the air pressure Pout because of, for example, a breakdown of the exhaust system, the control functions to energize the pump 16 so that the nozzles 14 discharge ultrapure water in the form of a sheet 15 to form a barrier across the air intake opening 12 for preventing mist or vapor of chemical cleaning liquid from diffusing outside the cleaning/drying box 11 through the air intake opening 12. The air intake mechanism may be modified such that the water barrier is formed during a cleaning and/or drying operation of a substrate.

Figure 8:
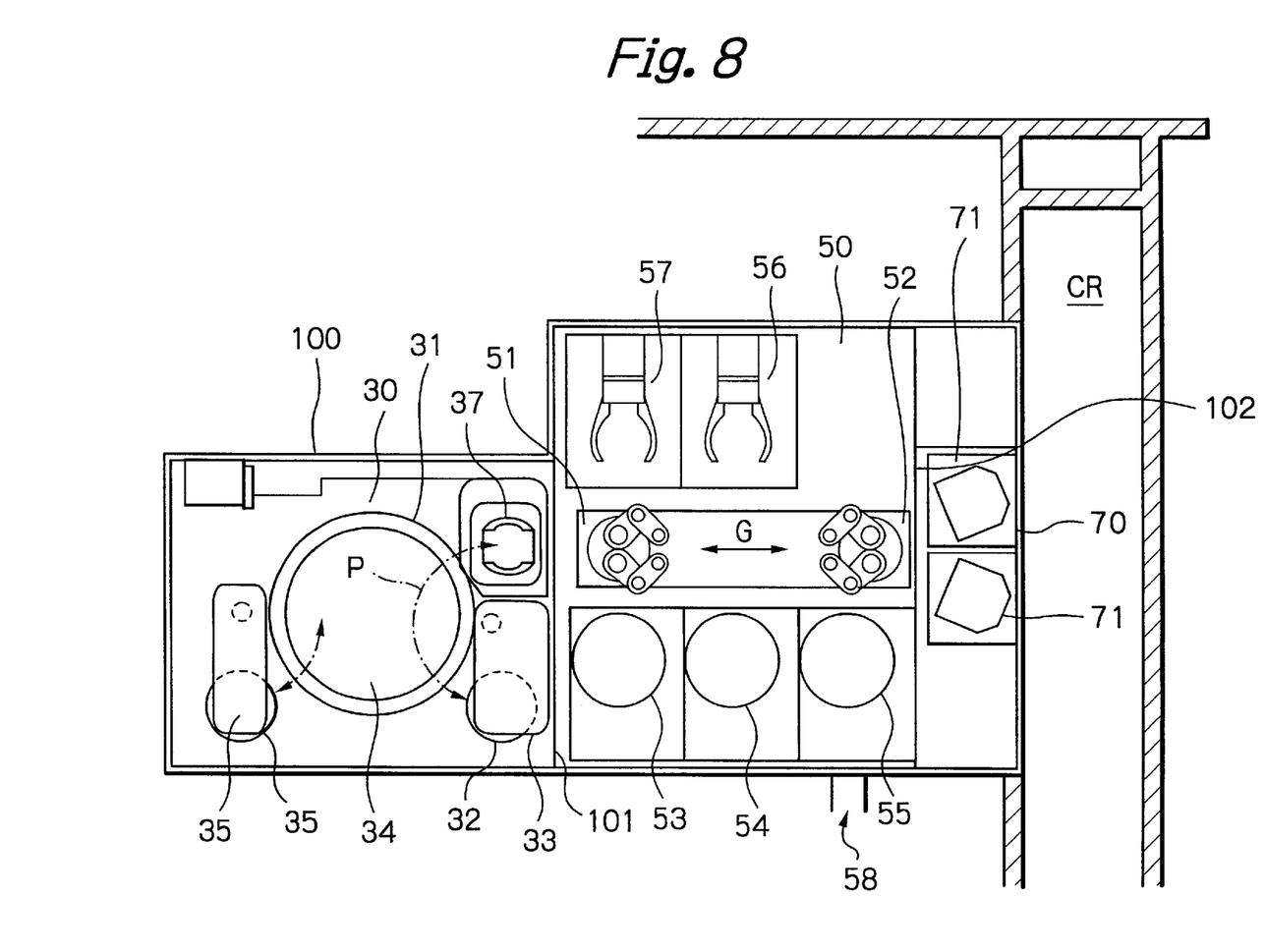
FIG. 8 is a schematic plan view of a substrate polishing apparatus in accordance with the present invention.
Figure 9:
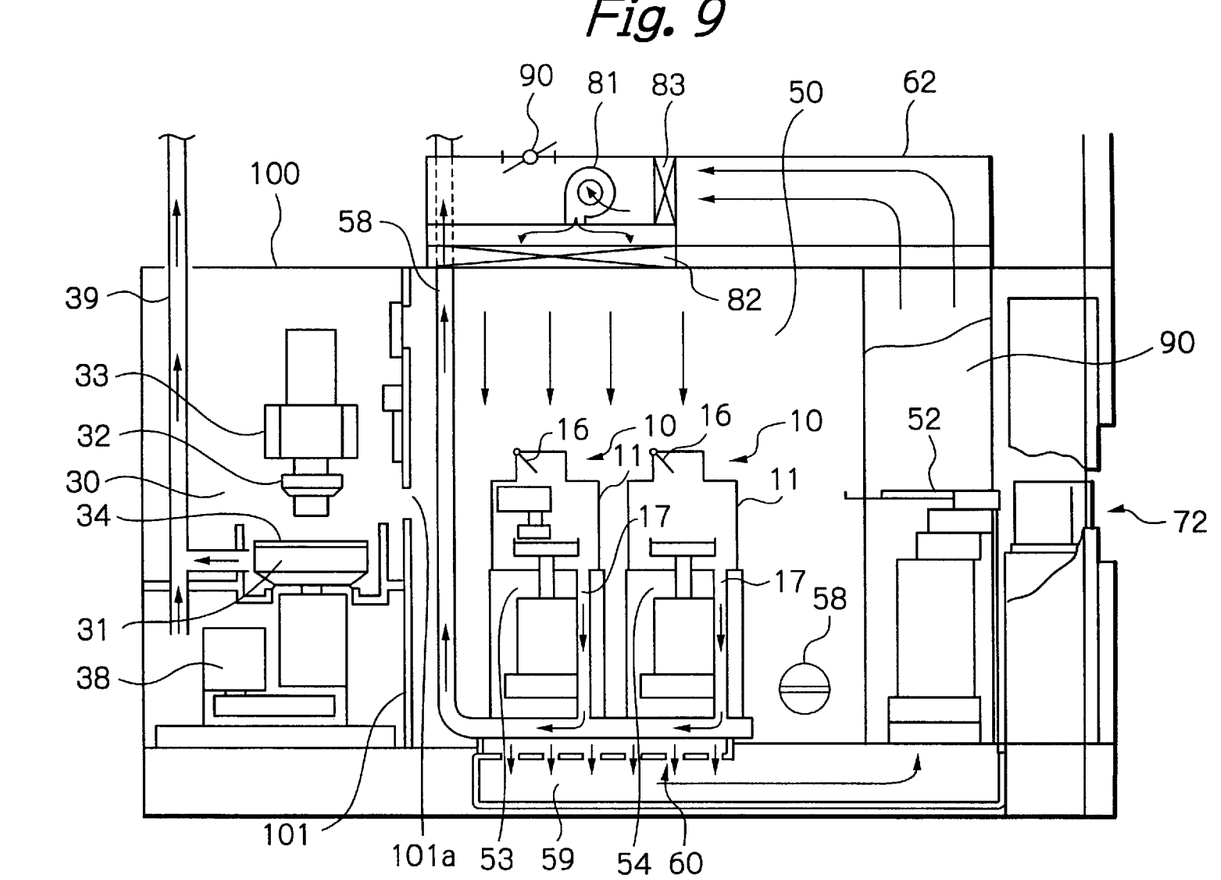
FIG. 9 is a schematic side-elevational view of the substrate polishing apparatus of FIG. 8.

FIGS. 8 and 9 are a plan view and a cross-sectional side elevation view of a substrate polishing apparatus equipped with cleaning apparatuses in accordance with the present invention and positioned in a clean room. As shown, the polishing apparatus includes a closed-type housing 100 which is divided by partitions 101 and 102 into three chambers: a polishing chamber 30, a cleaning chamber 50, and a substrate cassette loading/unloading chamber 70. Reference numerals 51 and 52 denote transfer robots for transferring semiconductor substrates from one of these chambers to another as explained later.

The polishing chamber 30 is provided with a turntable 31 having a polishing pad 34 on its upper surface and a substrate carrier 32 for bringing a semiconductor substrate into contact with the polishing pad 34 to conduct a polishing operation of the substrate. The substrate carrier 32 is mounted on a distal end of a pivotal arm 33, whereby the substrate carrier 32 is moved from a retracted position shown in FIG. 8 along an arch path designated by an arrow P so that the substrate carrier 32 is operable to remove a substrate from the substrate lift 37 and bring it into contact with the polishing pad 34 and to return the substrate to the substrate lift 37. Reference numeral 35 denotes a tool for dressing or conditioning the polishing pad 34, which tool is mounted on a distal end of a pivotal arm 36. In FIG. 9, reference numeral 39 denotes an exhaust duct for discharging air containing mist of slurry and/or dust generated during a polishing operation.

The cleaning chamber 50 is, as shown in FIG. 8, provided with first through third cleaning apparatuses 53–55, although, for the sake of clarity, only the first and second cleaning apparatuses 53 and 54 are shown in FIG. 9. While at least one of the cleaning apparatuses is constructed as shown in the aforementioned embodiments, in the embodiment of FIG. 9, both of the first and second cleaning apparatus 53 and 54 are constructed in the same manner as that shown in FIGS. 1 and 2. The cleaning apparatuses 53 and 54 include cleaning/drying boxes 11 and exhaust openings 17 of these boxes are connected to a common exhaust conduit 58. The cleaning chamber 50 is provided with an air cleaning system comprising a blower 81 and air filters 82 and 83 for cleaning the air in the cleaning chamber 50. The air cleaning system comprises a duct comprising an upper duct segment 62 located on th e ceiling wall of the cleaning chamber 50, and provided inside this upper duct segment 62 are the blower 81 and the air filters 82. The air cleaning system also comprises a lower horizontal duct segment 59 positioned beneath the lower or bottom wall of the cleaning chamber 50, and a vertical duct-segment 61 connecting the upper and lower duct segments 62 and 59. The upper duct segment 62 is fluidly connected to the cleaning chamber 50 through a through opening (not shown) which is formed in the ceiling wall of the cleaning chamber 50 and filled with the air filter 82. The lower duct segment 59 is fluidly connected to the cleaning chamber 50 trough a plurality of holes 60 formed in the bottom wall of the cleaning chamber 50. In this embodiment, the filter 82 is a HEPA or ULPA filter 82 for removing fine particles of less than 0.1 micron, and the filter 83 is a chemical filter 83 for removing harmful gas. The blower 81 causes an air flow which, as shown by arrows in FIG. 9, follows a circulation path consisting of the duct of the air supplement duct system 59, 61 and 62 and the cleaning chamber 50. Although air in the cleaning/drying boxes 11 of the cleaning apparatuses 53 and 54 is continuously discharged outside through the common exhaust duct 58, supplement of clean air is supplied from a clean room, in which the polishing apparatus is installed, through an opening 90 formed in the upper duct segment 62 and also openings (not shown) for effecting loading/unloading of substrate cassettes with respect to the loading/unloading chamber 70. Some amount of air flows from the cleaning chamber 50 into the polishing chamber 30 through an opening 110a formed in the partition 101. In FIGS. 8 and 9, reference numeral 58 denotes an exhaust opening for discharging air outside the cleaning chamber 50.

In FIG. 8, reference numerals 56 and 57 denote substrate reversing devices. The substrate reversing device 56 is adapted to receive a substrate from the transfer robot 52, which has removed the substrate from one of the substrate cassettes 71 in the loading/unloading chamber 70, and to reverse it upside down so that a surface of the substrate to be polished is directed downwards, so that the second transfer robot 51 can remove the reversed substrate and transfer it to the substrate lift 37 in the polishing chamber 30 for conducting a polishing operation of the substrate. Upon completion of a polishing operation in the polishing chamber, the substrate is transferred by the second transfer robot 51 from the substrate lift 37 to the second substrate reversing device 57. The second substrate reversing device 57 reverses the substrate to direct the polished surface upwards to enable the second transfer robot 51 to transfer the substrate with the polished surface facing upwards to the first cleaning apparatus 53. The substrate is then successively transferred from the first through the third cleaning apparatuses to clean the substrate and dry the substrate in the third cleaning apparatus by spin-drying and, finally is returned to the loading/unloading chamber by the first transfer robot 52.

In accordance with the embodiments of the present invention, it is possible to prevent a cleaning liquid in a mist or gas form from diffusing outside the cleaning/drying box even if an air pressure in the cleaning/drying box becomes greater than an air pressure outside the cleaning/drying box. Further, it is possible to conduct both of cleaning and drying of a substrate in a single cleaning/drying box and thus to make the cleaning apparatus small. Furthermore, it is possible to prevent a substrate which has been cleaned from being contaminated by a cleaning liquid which has already been removed from the substrate.

It should be noted that the present invention is not limited to the foregoing embodiments but can be modified in a variety of ways.

What is claimed is:

1. A substrate cleaning apparatus comprising:
a box in which a substrate is to be cleaned with a cleaning liquid;
an exhaust system for exhausting said box, said box having an air intake opening for introducing air into said box to create an air flow passing around the substrate in said box and thereafter entering said exhaust system;
a pressure sensor in said box for sensing inside air pressure in said box; and
a door operable to close said air intake opening when the inside air pressure in said box becomes greater than an outside air pressure outside said box.

2. A substrate cleaning apparatus comprising:
a box in which a substrate is to be cleaned with a cleaning liquid;
an exhaust system for exhausting said box, said box having an air intake opening for introducing air into said box to create an air flow passing around the substrate in said box and thereafter entering said exhaust system and
a door operable to close said air intake opening when an inside air pressure in said box becomes greater than an outside air pressure outside said box,
wherein said box includes an upper part and a lower part, said air intake opening is provided at said upper part of said box, and said exhaust system is fluidly connected to said box at said lower part of said box to create an air flow flowing down in said box.

3. The substrate cleaning apparatus as set forth in claim 2, wherein said box includes a top wall and a bottom wall, said air intake opening is provided in said top wall, and said exhaust system is fluidly connected to said box at said bottom wall.

4. The substrate cleaning apparatus as set forth in claim 3, wherein said door is pivotably supported such that said door is positionable under action of its weight to close said air intake opening, and such that said door is pivotable to open said air intake opening under influence of a difference between the inside air pressure and the outside air pressure when the inside air pressure becomes lower than the outside air pressure.

5. The substrate cleaning apparatus as set forth in claim 1, further comprising a control for functioning to move said door to a position where said door closes said air intake opening or to a position where said door opens said air intake opening on the basis of a difference between the inside air pressure and the outside air pressure.

6. The substrate cleaning apparatus as set forth in claim 1, wherein said box includes inside thereof a substrate rotating mechanism for rotating the substrate about its central axis, and at least one nozzle for supplying cleaning liquid to the substrate, while the substrate is rotated by said substrate rotating mechanism, to conduct a cleaning operation of the substrate, wherein said substrate rotating mechanism is also operable to rotate the substrate at high speed after completion of the cleaning operation to dry the substrate.

7. A substrate cleaning apparatus comprising:
a box in which a substrate is to be cleaned with a cleaning liquid;
an exhaust system for exhausting said box,
wherein said box is provided with an air intake opening for introducing air into said box to create an air flow passing around the substrate in said box and thereafter entering said exhaust system, and is provided thereinside with at least one water nozzle for discharging water to form a water barrier across said air intake opening for preventing the cleaning liquid in mist or gas form from dispersing outside said box through said air intake opening; and
a pressure sensor in said box for sensing air pressure in said box and controlling discharge of water from said at least one water nozzle.

8. A substrate cleaning apparatus comprising:
a box in which a substrate is to be cleaned with a cleaning liquid; and
an exhaust system for exhausting said box,
wherein said box is provided with an air intake opening for introducing air into said box to create an air flow passing around the substrate in said box and thereafter entering said exhaust system, and is provided thereinside with at least one water nozzle for discharging water to form a water barrier across said air intake opening for preventing the cleaning liquid in mist or gas form from dispersing outside said box through said air intake opening,
wherein said air intake opening has opposite side edges, and
wherein said at least one water nozzle comprises two water nozzles extending along said opposite side edges, respectively, with said two water nozzles being constructed and arranged to discharge water in the form of sheets in such a manner that the water discharged from said two water nozzles cross each other to form the barrier.

9. A substrate cleaning apparatus comprising:
a box in which a substrate is to be cleaned with a cleaning liquid;
an exhaust system for exhausting said box,
wherein said box is provided with an air intake opening for introducing air into said box to create an air flow passing around the substrate in said box and thereafter entering said exhaust system, and is provided thereinside with at least one water nozzle for discharging water to form a water barrier across said air intake opening for preventing the cleaning liquid in mist or gas form from dispersing outside said box through said air intake opening; and
a plurality of baffle plates over said air intake opening to form a plurality of air passages which allow air to freely pass therethrough, and which also prevent the water discharged from said at least one water nozzle from scattering outside said box through said air intake opening.

10. The substrate cleaning apparatus as set forth in claim 7, further comprising a control for operating said at least one water nozzle to discharge water to form the barrier across said air intake opening when an air pressure in said box is greater than an air pressure outside said box or when said exhaust system is broken.

11. The substrate cleaning apparatus as set forth in claim 7, wherein said box includes inside thereof a substrate rotating mechanism for rotating the substrate about its central axis, and at least one nozzle for supplying cleaning liquid to the substrate, while the substrate is rotated by said substrate rotating mechanism, to conduct a cleaning operation of the substrate, wherein said substrate rotating mechanism is also operable to rotate the substrate at high speed after completion of the cleaning operation of the substrate to dry the substrate.

12. A substrate polishing apparatus comprising:
a housing having a polishing chamber and cleaning chamber,
said polishing chamber being provided thereinside with a turntable having a polishing surface, and a substrate carrier for carrying a substrate to bring the substrate into contact with said polishing surface for polishing the substrate, and
said cleaning chamber being provided with at least one cleaning apparatus including
(i) a box in which the substrate is to be cleaned with a cleaning liquid, and
(ii) an exhaust system for exhausting said box, said box being provided with an air intake opening for introducing air into said box to create an air flow passing around the substrate in said bow and thereafter entering said exhaust system;
a pressure sensor in said box for sensing inside air pressure in said box; and
a door operable to close said air intake opening when the inside air pressure in said box becomes greater than an outside air pressure outside said box.

13. The substrate cleaning apparatus as set forth in claim 12, wherein said box is provided thereinside with a substrate rotating mechanism for rotating the substrate about its central axis, and at least one nozzle for supplying cleaning liquid to the substrate, while the substrate is rotated by said substrate rotating mechanism, to conduct a cleaning operation of the substrate, wherein said substrate rotating mechanism is also operable to rotate the substrate at high speed after completion of the cleaning operation of the substrate to dry the substrate.

14. A substrate polishing apparatus comprising:
a housing having a polishing chamber and cleaning chamber,
said polishing chamber being provided thereinside with a turntable having a polishing surface, and a substrate carrier for carrying a substrate to bring the substrate into contact with said polishing surface for polishing the substrate, and
said cleaning chamber being provided with at least one cleaning apparatus including
(i) a box in which the substrate is to be cleaned with a cleaning liquid, and
(ii) an exhaust system for exhausting said box,
said box being provided with an air intake opening for introducing air into said box to create an air flow passing around the substrate in the box and thereafter entering said exhaust system, and also being provided thereinside with a water nozzle for discharging water to form a water barrier across said air intake opening for preventing the cleaning liquid in mist or gas form from dispersing outside said box through said air intake opening; and
a pressure sensor in said box for sensing air pressure in said box and controlling discharge of water from said water nozzle.

15. The substrate cleaning apparatus as set forth in claim 14, wherein said box is provided thereinside with a substrate rotating mechanism for rotating the substrate about its central axis, and at least one nozzle for supplying cleaning liquid to the substrate, while the substrate is rotated by said substrate rotating mechanism, to conduct a cleaning operation of the substrate, wherein said substrate rotating mechanism is also operable to rotate the substrate at high speed after completion of the cleaning operation of the substrate to dry the substrate.

16. The substrate leaning apparatus according to claim 1, wherein said door is operable, in response to the inside air pressure in said box as sensed by said pressure sensor, to close said air intake opening when the inside air pressure in said box as sensed by said pressure sensor becomes greater than the outside air pressure outside said box.

17. The substrate cleaning apparatus according to claim 12, wherein said door is operable, in response to the inside air pressure in said box as sensed by said pressure sensor, to close said air intake opening when the inside air pressure in said box as sensed by said pressure sensor becomes greater than the outside air pressure outside said box.

* * * * *